(12) United States Patent
Tseng (10) Patent No.: US 10,566,513 B1
(45) Date of Patent: Feb. 18, 2020

(54) LED CIRCUIT STRUCTURE

(71) Applicant: Chieh-Chen Tseng, Hsinchu County (TW)

(72) Inventor: Chieh-Chen Tseng, Hsinchu County (TW)

(*) Notice: Subject to any disclaimer, the term of this patent is extended or adjusted under 35 U.S.C. 154(b) by 0 days.

(21) Appl. No.: 16/133,635

(22) Filed: Sep. 17, 2018

(51) Int. Cl.
*H01L 33/64* (2010.01)
*H01L 33/38* (2010.01)
*H01L 33/48* (2010.01)
*H05B 33/08* (2020.01)

(52) U.S. Cl.
CPC ............ *H01L 33/642* (2013.01); *H01L 33/38* (2013.01); *H01L 33/382* (2013.01); *H01L 33/387* (2013.01); *H01L 33/486* (2013.01); *H01L 33/641* (2013.01); *H05B 33/0806* (2013.01); *H01L 2933/0075* (2013.01)

(58) Field of Classification Search
CPC ..... H01L 33/642; H01L 33/382; H01L 33/38; H01L 33/387; H01L 33/486; H05B 33/0806
See application file for complete search history.

(56) References Cited

U.S. PATENT DOCUMENTS

| 9,028,092 | B2 * | 5/2015 | Zhang | F21V 21/005 362/218 |
| 2009/0145753 | A1 * | 6/2009 | Yang | C12Q 1/005 204/403.01 |
| 2012/0256205 | A1 * | 10/2012 | Low | H01L 33/642 257/88 |
| 2013/0070452 | A1 * | 3/2013 | Urano | H05K 1/181 362/231 |
| 2013/0134462 | A1 * | 5/2013 | Kim | H01L 33/08 257/98 |
| 2014/0334156 | A1 * | 11/2014 | Lorenz | H05B 33/0806 362/249.06 |
| 2018/0058649 | A1 * | 3/2018 | Hamby | F21S 4/24 |

* cited by examiner

*Primary Examiner* — Joseph C. Nicely
(74) *Attorney, Agent, or Firm* — Che-Yang Chen; Law Offices of Scott Warmuth (57) ABSTRACT

The utility model provides a light-emitting diode (LED) circuit structure. First cutout performed a substrate forms plural first cutout regions and plural first material regions. Second cutout performed on the substrate forms plural second cutout regions, plural third cutout regions, plural second material regions, and plural third material regions. Besides, a second adhering layer is adhered to another side, which is opposite to the substrate, of the first adhering layer; a heat dissipation layer is adhered to another side, which is opposite the first adhering layer, of the second adhering layer. Accordingly, such the LED circuit does not require conventional electroplating, etching, and washing processes, and further not only the effect of saving energy and reducing carbon emission can be achieved, but also the effect of being flexible, reducing a manufacturing time and reducing manufacturing costs can be achieved.

3 Claims, 7 Drawing Sheets

LED CIRCUIT STRUCTURE

BACKGROUND OF THE INVENTION

1. Technical Field

The present utility model relates to a flexible light-emitting diode (LED) circuit structure that can be manufactured by a reduced time and in decreased costs.

2. Background Art

With advantages such as a long service life, low energy consumption, and a small volume, LEDs are gradually used as light sources of various light emitting apparatuses to replace conventional light source devices. Besides, with the rise of the environmental protection awareness around the world, energy conservation and power saving has become at rend nowadays. LED products have advantages of being energy-conserving and power-saving, being efficient, responding quickly, having a long service life, containing no mercury, being environmentally-friendly, and so on. However, light output efficiency of current LEDs ranges from 20% to 30%, and the remaining 70% to 80% of the electricity is all converted into heat.

If the heat cannot be dissipated smoothly, the temperature of the LED products will become excessively high, thus affecting the service life, luminous efficiency and stability of the products.

A substrate is an important part in an LED apparatus. The substrate is mainly used for dissipating heat generated between an LED and a system circuit board. Commonly known LED substrates include silicon substrates, silicon carbide substrates, aluminum nitride ceramic substrates, aluminum oxide ceramic substrates, and so on. In addition, a general processing procedure of a heat dissipation aluminum substrate is as follows: (degreasing/pickling→washing→micro-etching/mechanical plate grinding→washing→drying)→PE film stripping→film attaching (preheating→film attaching→cooling)→exposing→PET film stripping→film stripping→developing (developing-→washing→drying)→etching.

Because the heat dissipation aluminum substrate cannot be bent, it is not applicable to special curved surfaces and cannot meet special requirements. Moreover, the heat dissipation aluminum substrate needs to be subject to the foregoing processing procedure before a conductive circuit is formed, and each step in the processing procedure requires a very long processing time. The etching and electroplating processes easily cause environmental pollution and cannot save energy or reduce carbon emission.

Moreover, the LED substrate requires a long manufacturing time, and requires relatively high manufacturing costs.

Therefore, how to solve the problems and defects in the prior art is an issue that the designer of the present utility model and related vendors in the industry need to study and address urgently.

SUMMARY OF THE UTILITY MODEL

In order to effectively solve the foregoing problem, a main objective of the present utility model is to provide a flexible LED circuit structure that can reduce a manufacturing time and manufacturing costs.

In order to achieve the foregoing objective, the present utility model provides an LED circuit structure. The LED circuit structure includes: a substrate, a first adhering layer, a second adhering layer and a heat dissipation layer.

On the substrate, a plurality of first cutout regions and a plurality of first material regions apart from the first cutout regions are formed. Further, a plurality of second cutout regions and a plurality of second material regions apart from the second cutout regions are formed on the substrate. The second cutout regions partially overlap with the first cutout regions. The adjacent first material regions are connected in series through the second material regions.

Further, a plurality of third cutout regions and a plurality of third material regions apart from the third cutout regions are formed on the substrate. The third cutout regions partially overlap with the first cutout regions and the second cutout regions, and the adjacent first material regions are connected in parallel through the third material regions.

The first adhering layer is adhered to one side of the substrate and positions the plurality of first material regions. The second material regions and the third material regions are disposed on the first adhering layer. The second adhering layer is disposed on another side, which is opposite to the substrate, of the first adhering layer. The heat dissipation layer is disposed on another side, which is opposite to the first adhering layer, of the second adhering layer. Further, an LED grain is disposed on each first material region.

Accordingly, such the LED circuit does not require conventional electroplating, etching, and washing processes, and further not only the effect of saving energy and reducing carbon emission can be achieved, but also the effect of being flexible, reducing a manufacturing time and reducing manufacturing costs can be achieved.

DETAILED DESCRIPTION

Figure 1:
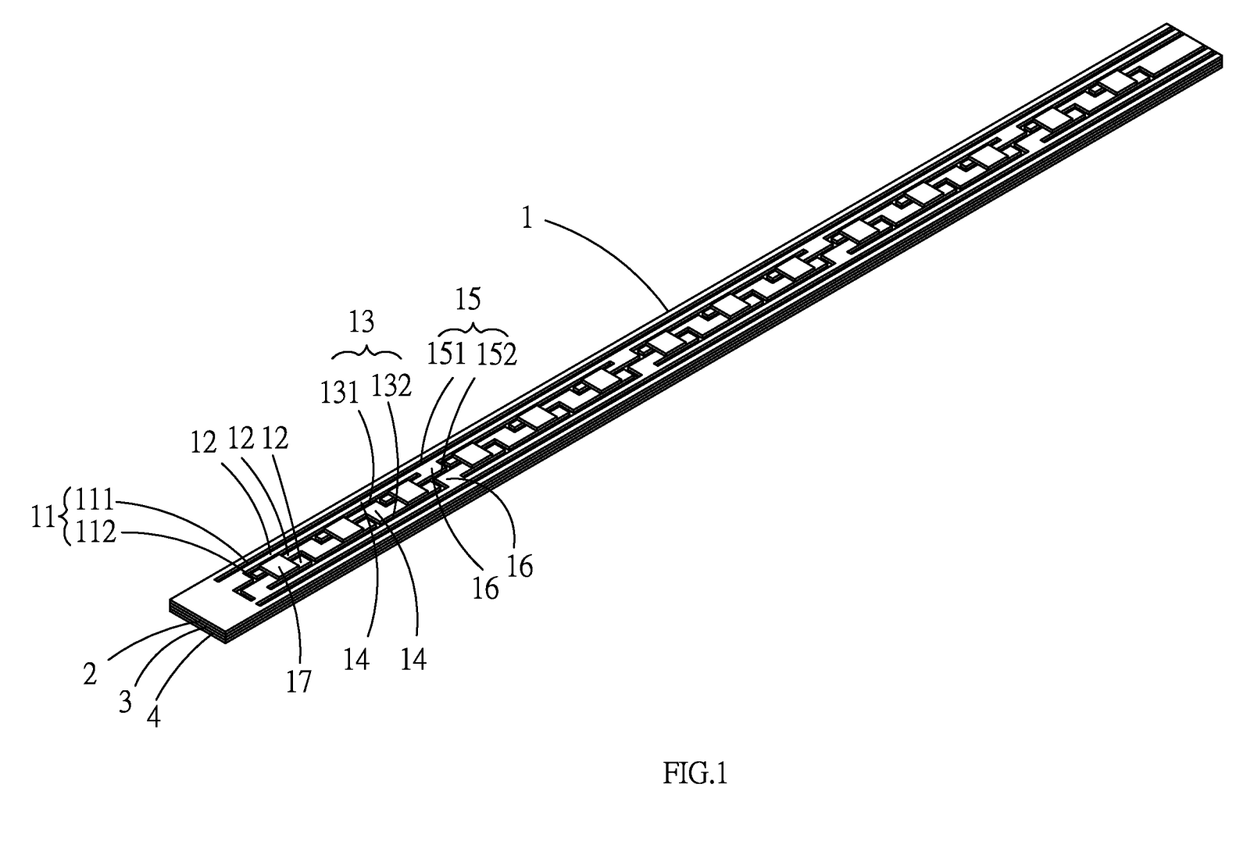
FIG. 1 is a three-dimensional schematic diagram of a preferred embodiment of the present utility model.
Figure 2:
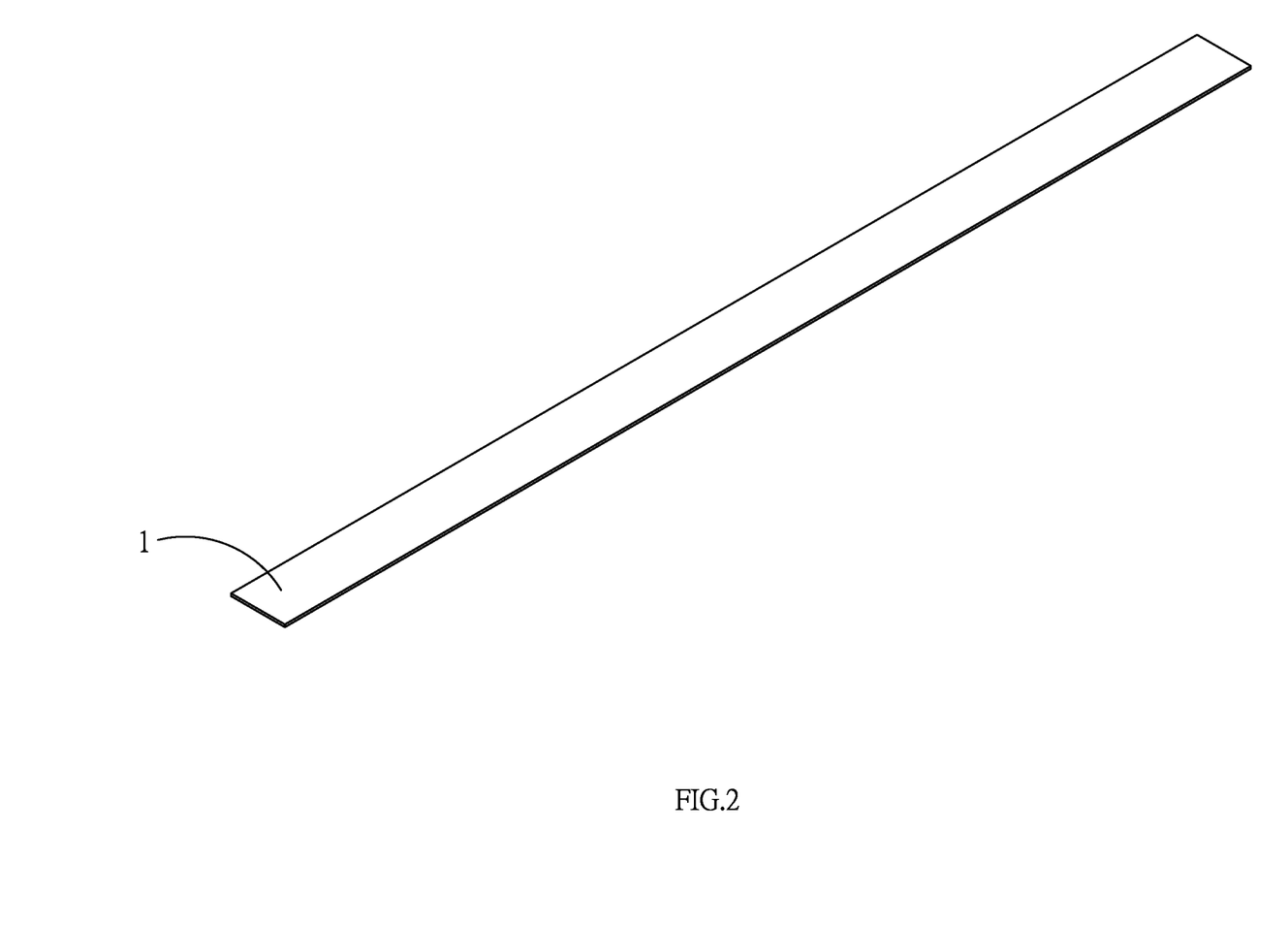
FIG. 2 is a first schematic implementation diagram of a preferred embodiment of the present utility model.
Figure 3:
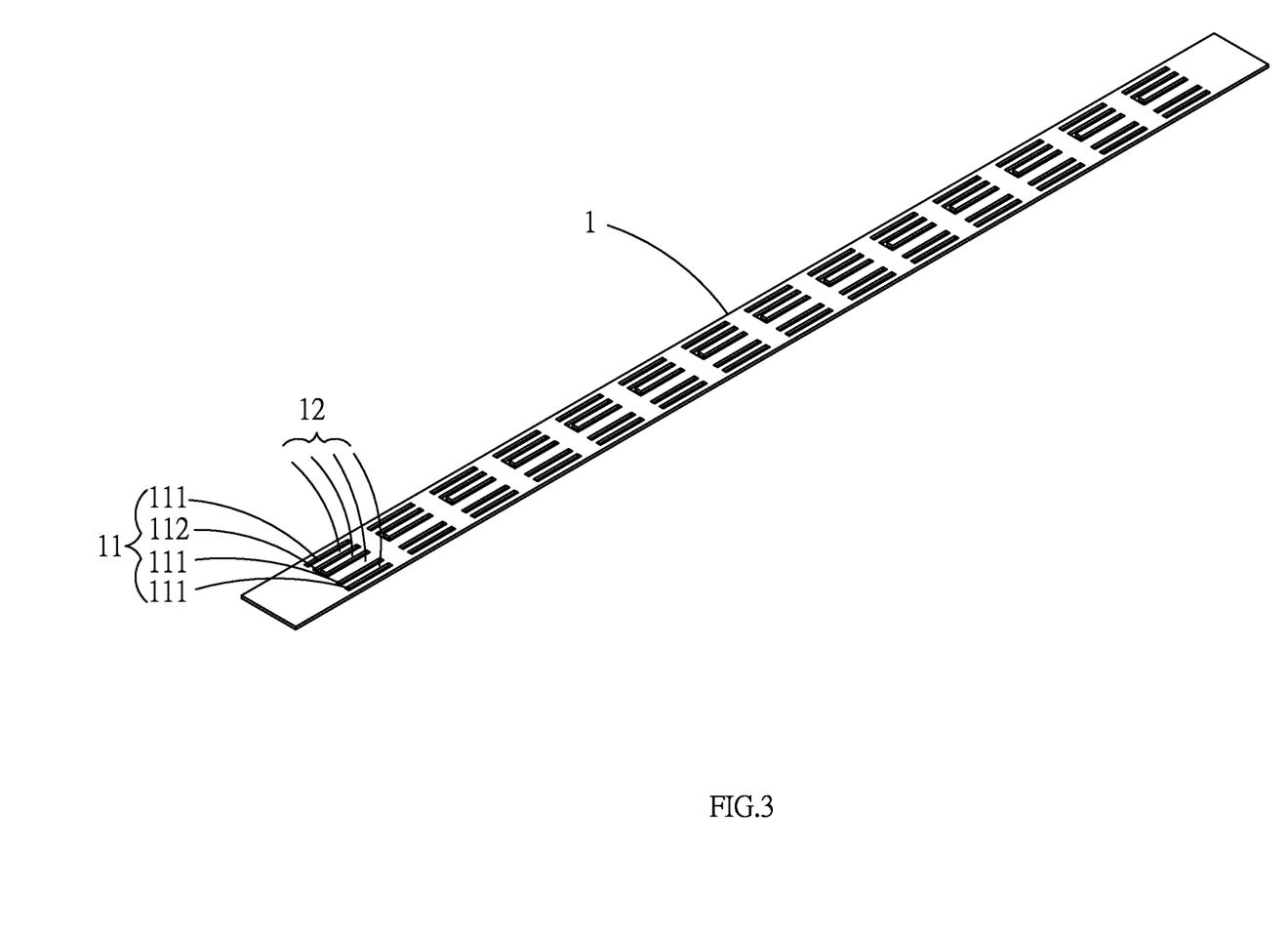
FIG. 3 is a second schematic implementation diagram of a preferred embodiment of the present utility model.
Figure 4:
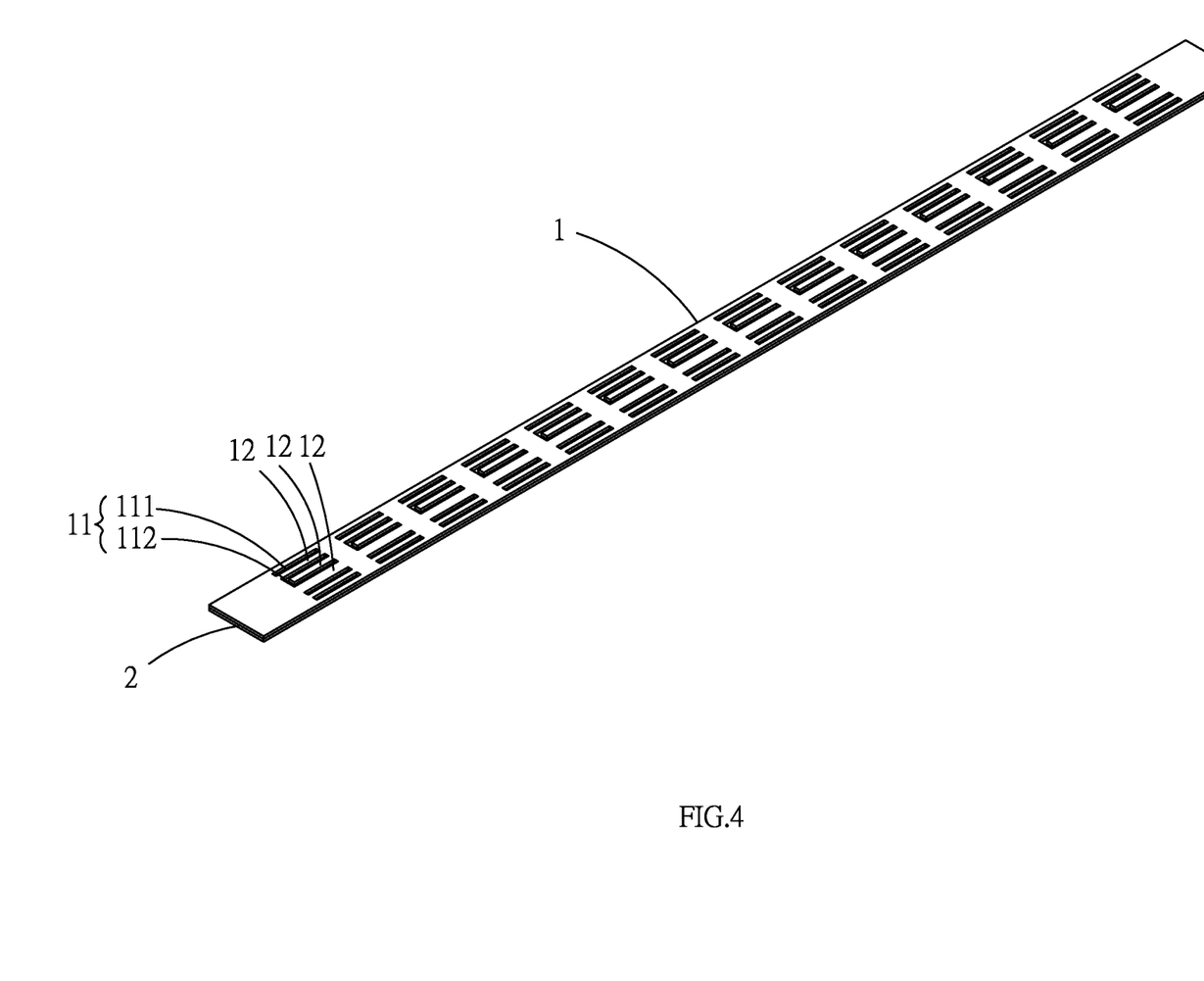
FIG. 4 is a third schematic implementation diagram of a preferred embodiment of the present utility model.
Figure 5:
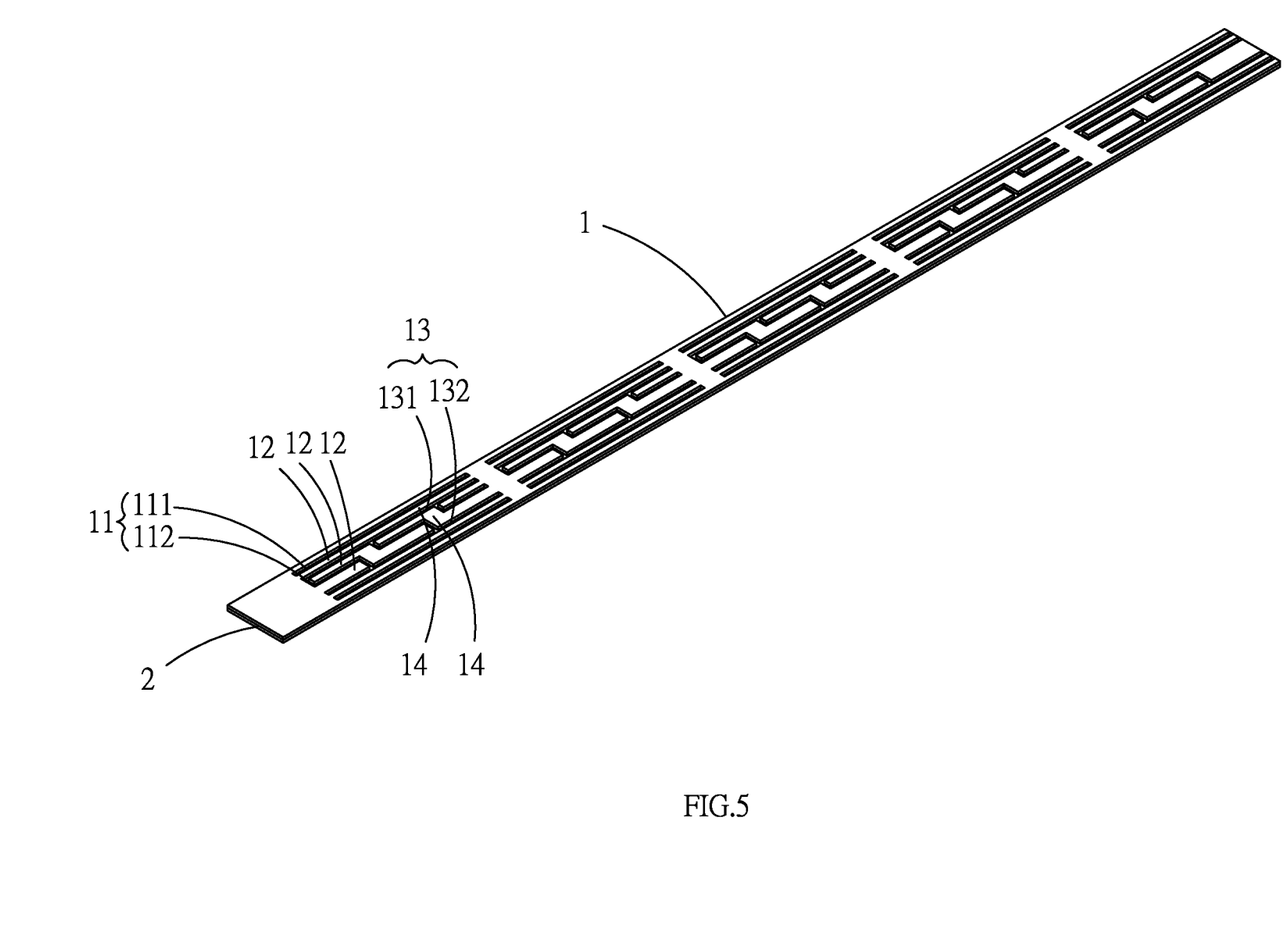
FIG. 5 is a fourth schematic implementation diagram of a preferred embodiment of the present utility model.
Figure 6:
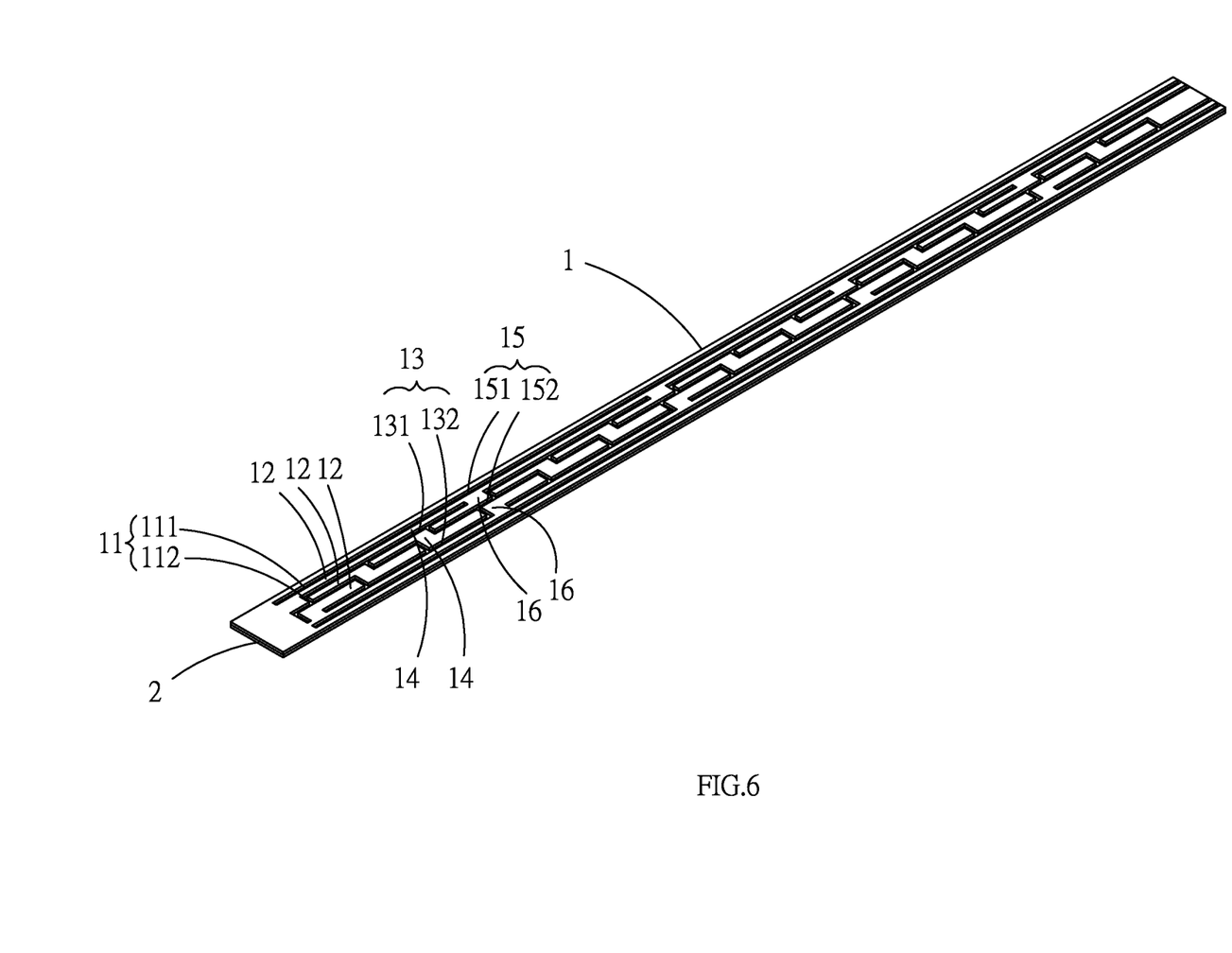
FIG. 6 is a fifth schematic implementation diagram of a preferred embodiment of the present utility model.
Figure 7:
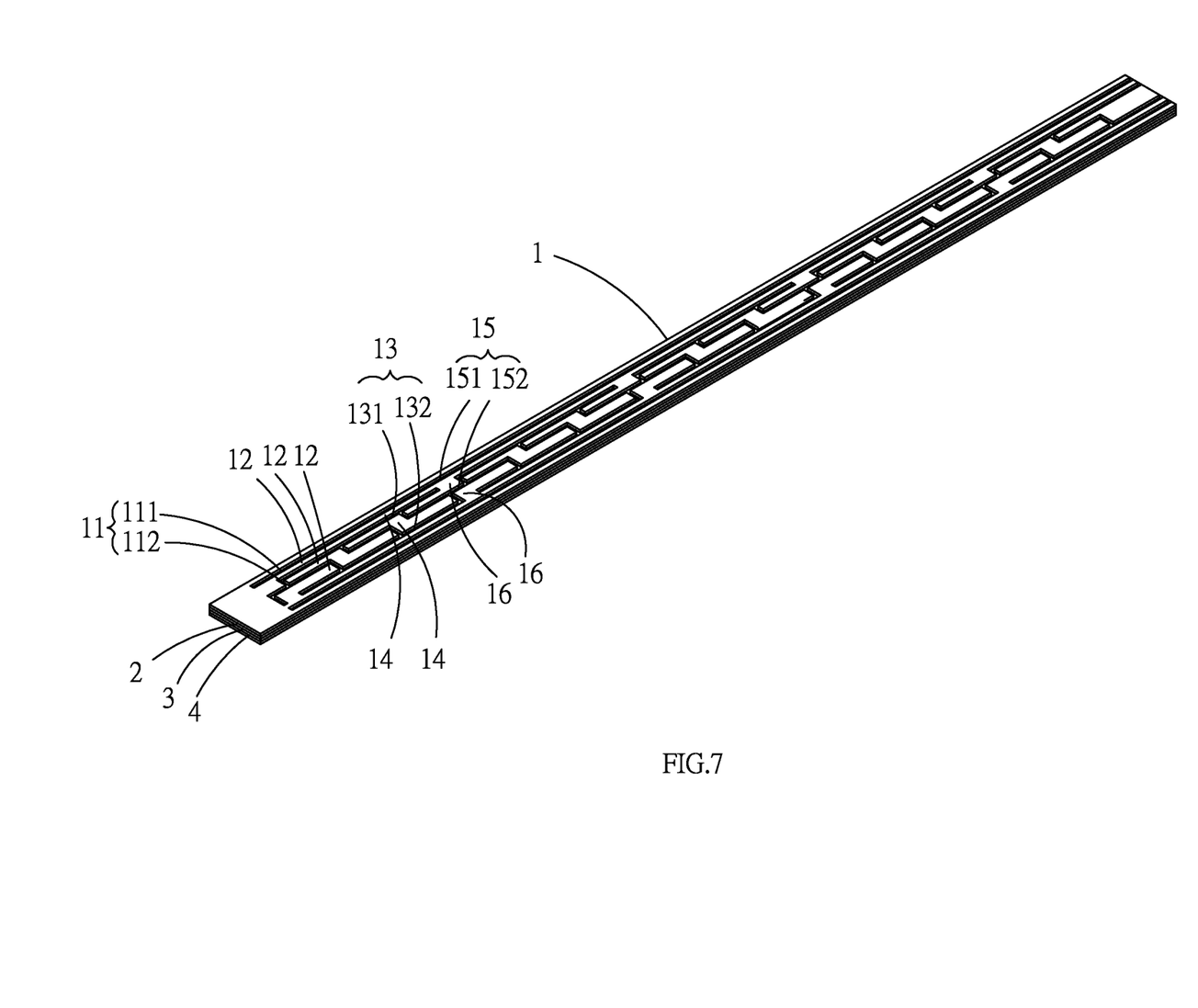
FIG. 7 is a sixth schematic implementation diagram of a preferred embodiment of the present utility model.

Referring to FIG. 1 to FIG. 7, FIG. 1 to FIG. 7 are a three-dimensional schematic diagram and a first to sixth schematic implementation diagrams of an LED circuit structure according to the present utility model. It can be clearly seen from the figures that the LED circuit structure includes a substrate 1, a first adhering layer 2, a second adhering layer 3 and a heat dissipation layer 4.

First cutout regions 11, second cutout regions 13 and third cutout regions 15 are formed on the substrate 1. In addition, a plurality of first material regions 12, a plurality of second material regions 14, and a plurality of third material regions 16 are further formed on the substrate 1 at the positions of the first cutout regions 11.

The first cutout region 11 consists of three first linear regions 111 and a first U-shaped region 112. One first linear region 111 is formed on one side of the first U-shaped region 112, and the other two first linear regions 111 are formed on the other side of the first U-shaped region 112. In this embodiment, the one first linear region 111 is formed at an upper side edge of the first U-shaped region 112, and the other two first linear regions 111 are formed at a lower side edge of the first U-shaped region 112. After cutout by the first cutout regions 11, remaining regions of the substrate 1 are the first material regions 12.

At least one LED grain 17 is disposed on the first material region 12 within the first U-shaped region 112 and the first material region 12 between the first linear regions 111 on one side. Further, the second cutout region 13 consists of three groups of second linear regions 131 and a second L-shaped region 132. Two second linear regions 131 are formed on one side of the second L-shaped region 132, and the other second linear region 131 is formed on the other side of the second L-shaped region 132.

In this embodiment, the two second linear regions 131 are formed at an upper side edge of the second L-shaped region 132, and the other second linear region 131 is formed at a lower side edge of the second L-shaped region 132. The third cutout region 15 consists of two third linear regions 151 and a third L-shaped region 152. One third linear region 151 is formed on one side of the third L-shaped region 152, and the other third linear region 151 is formed on the other side of the third L-shaped region 152.

After cutout by the second cutout regions 13 and the third cutout regions 15, remaining regions of the substrate 1 are the second material regions 14 and the third material regions 16 respectively. The second cutout regions 13 partially overlap with the first cutout regions 11. The third cutout regions 15 partially overlap with the first cutout regions 11 and the second cutout region 13. The adjacent first material regions 12 are connected in series through the second material regions 14, and the adjacent first material regions 12 are connected in parallel through the third material regions 16.

Thereby, such the LED circuit does not require conventional electroplating, etching, and washing processes, and not only the effect of saving energy and reducing carbon emission can be achieved, but also the effect of being flexible, reducing a manufacturing time and reducing manufacturing costs can be achieved.

The substrate 1 is a flexible substrate 1. First cutout is performed on the substrate 1 by means of laser or stamping, so that a plurality of first cutout regions 11 and a plurality of first material regions 12 are formed on the substrate 1. The first cutout region 11 consists of three first linear regions 111 and a first U-shaped region 112. One first linear region 111 is formed on one side of the first U-shaped region 112, and the other two first linear regions 111 are formed on the other side of the first U-shaped region 112. In this embodiment, the one first linear region 111 is formed at an upper side edge of the first U-shaped region 112, and the other two first linear regions 111 are formed at a lower side edge of the first U-shaped region 112.

After cutout by the first cutout regions 11, remaining regions of the substrate 1 are the first material regions 12. The first material regions 12 formed on the substrate 1 after the first cutout is adhering and positioned by using a first adhering layer 2, so that the first material regions 12 are adhering on the first adhering layer 2.

Further, second cutout is performed on the substrate 1 by means of laser and stamping. The second cutout regions 13 and the third cutout regions 15 are formed on the substrate 1 after the second cutout. The second material regions 14 are further formed on the substrate 1 at the positions of the second cutout regions 13. The third material regions 16 are further formed on the substrate 1 at the positions of the third cutout regions 15.

The second cutout region 13 consists of three second linear regions 131 and a second L-shaped region 132. Two second linear regions 131 are formed on one side of the second L-shaped region 132, and the other second linear region 131 is formed on the other side of the second L-shaped region 132. In this embodiment, the two second linear regions 131 are formed at an upper side edge of the second L-shaped region 132, and the other second linear region 131 is formed at a lower side edge of the second L-shaped region 132.

The third cutout region 15 consists of two third linear regions 151 and a third L-shaped region 152. One third linear region 151 is formed on one side of the third L-shaped region 152, and the other third linear region 151 is formed on the other side of the third L-shaped region 152.

After cutout by the second cutout regions 13 and the third cutout regions 15, remaining regions of the substrate 1 are the second material regions 14 and the third material regions 16 respectively. The second cutout regions 13 partially overlap with the first cutout regions 11. The third cutout regions 15 partially overlap with the first cutout regions 11 and the second cutout region 13. The adjacent first material regions 12 are connected in series through the second material regions 14, and the adjacent first material regions 12 are connected in parallel through the third material regions 16.

After the first material regions 12, the second material regions 14 and the third material regions 16 are formed, at least one LED grain 17 is disposed on the first material region 12 within the first U-shaped region 112 and the first material region 12 between the first linear regions 111 on one side. After the first material regions 12, the second material regions 14 and the third material regions 16 are formed on the substrate 1, the second adhering layer 3 is further adhered to a side, which is opposite to the substrate 1, of the first adhering layer 2.

After the second adhering layer 3 is adhered to the first adhering layer 2, the heat dissipation layer 4 is further adhered to a side, which is opposite to the first adhering layer 2, of the second adhering layer 3. The heat dissipation layer 4 is made of graphite or grapheme.

Thereby, such the LED circuit does not require conventional electroplating, etching, and washing processes, and further not only the effect of saving energy and reducing carbon emission can be achieved, but also the effect of being flexible, reducing a manufacturing time and reducing manufacturing costs can be achieved.

A plurality of first material regions 12, a plurality of second material regions 14 and a plurality of third material regions 16 that are arranged in arrays can be formed on the substrate 1. Then, each array is cut to form a plurality of substrates 1, and each substrate 1 can be disposed on the heat dissipation layer 4. The heat dissipation layer 4 is then cut, so that the heat dissipation layer 4 is adhered to one side of each substrate 1.

It should be noted that, described above are merely preferred embodiments of the present utility model, which are not intended to limit the present utility model. It should be noted that all changes made according to the idea of the present utility model without departing from the spirit scope of the present utility model, e.g., changes on the structure or arrangement pattern, various variations, modifications, and applications, and generated equivalent effects, should all fall within the patent scope of the present utility model.

What is claimed is:

1. A light-emitting diode (LED) circuit structure, comprising:

a substrate, on which a plurality of first cutout regions and a plurality of first material regions formed by the first cutout regions, and a plurality of second cutout regions and a plurality of second material regions formed by the second cutout regions, as well as a plurality of third cutout regions, and a plurality of third material regions formed by the third cutout regions are formed, wherein the first cutout region consists of three first linear regions and a first U-shaped region, one first linear region is formed on one side of the first U-shaped region, and the other two first linear regions are formed on the other side of the first U-shaped region; the second cutout region consists of three second linear regions and a second L-shaped region, two second linear regions are formed on one side of the second L-shaped region, and the other second linear region is formed on the other side of the second L-shaped region; the third cutout region consists of two third linear regions and a third L-shaped region, one third linear region is formed on one side of the third L-shaped region, and the other third linear region is formed on the other side of the third L-shaped region; the adjacent first material regions are connected in series through the second material regions, and the adjacent first material regions are connected in parallel through the third material regions;

a first adhering layer, wherein the first adhering layer is adhered to one side of the substrate and positions the plurality of first material regions, and the second material regions and the third material regions are disposed on the first adhering layer;

a second adhering layer, wherein the second adhering layer is adhered to another side, which is opposite to the substrate, of the first adhering layer; and a heat dissipation layer, where in the heat dissipation layer is adhered to another side, which is opposite to the first adhering layer, of the second adhering layer.

2. The LED circuit structure according to claim 1, wherein the adjacent first material regions are connected in series through the second material regions, and the adjacent first material regions are connected in parallel through the third material regions.

3. The LED circuit structure according to claim 1, wherein at least one LED grain is disposed on the first material region within the first U-shaped region and the first material region between the first linear regions on one side.

* * * * *